US012660324B2

(12) United States Patent
Pritchard et al.

(10) Patent No.: US 12,660,324 B2
(45) Date of Patent: Jun. 16, 2026

(54) LATERAL CAPACITORS OF SEMICONDUCTOR DEVICES

(71) Applicant: GlobalFoundries U.S. Inc., Malta, NY (US)

(72) Inventors: David Pritchard, Beacon, NY (US); Hong Yu, Clifton Park, NY (US); Zhixing Zhao, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 616 days.

(21) Appl. No.: 18/151,509

(22) Filed: Jan. 9, 2023

(65) Prior Publication Data

US 2024/0234448 A1 Jul. 11, 2024

(51) Int. Cl.
| | |
|---|---|
| *H10D 86/80* | (2025.01) |
| *H10D 86/00* | (2025.01) |
| *H10D 86/01* | (2025.01) |
| *H10P 90/00* | (2026.01) |
| *H10W 10/00* | (2026.01) |
| *H10W 10/10* | (2026.01) |
| *H10W 10/17* | (2026.01) |

(52) U.S. Cl.
CPC ............. *H10D 86/80* (2025.01); *H10D 86/01* (2025.01); *H10D 86/201* (2025.01); *H10P 90/1906* (2026.01); *H10W 10/014* (2026.01); *H10W 10/061* (2026.01); *H10W 10/17* (2026.01); *H10W 10/181* (2026.01)

(58) Field of Classification Search
CPC ...... H10D 86/80; H10D 86/01; H10D 86/201; H01L 21/76283
See application file for complete search history.

(56) References Cited

U.S. PATENT DOCUMENTS

| | | | | |
|---|---|---|---|---|
| 7,560,356 | B2 | 7/2009 | Lee | |
| 9,484,246 | B2 * | 11/2016 | Chou | ................. H10P 90/1906 |
| 9,917,103 | B1 | 3/2018 | Mulfinger et al. | |
| 10,580,684 | B2 | 3/2020 | Wallner et al. | |
| 10,727,108 | B2 * | 7/2020 | Pritchard | ............ H10P 90/1906 |
| 12,464,784 | B2 * | 11/2025 | Yu | ...................... H10D 30/6713 |
| 2002/0125521 | A1 * | 9/2002 | Schrems | ............... H10B 12/37 |
| | | | | 257/E21.651 |
| 2006/0211196 | A1 * | 9/2006 | Tanaka | ............... H10B 12/0385 |
| | | | | 438/243 |

(Continued)

FOREIGN PATENT DOCUMENTS

| | | | |
|---|---|---|---|
| CN | 1901165 A | * | 1/2007 |
| CN | 2906929 Y | * | 5/2007 |

(Continued)

OTHER PUBLICATIONS

European Patent Office, Extended European Search Report and Opinion issued in European Patent Application No. 23195307.6 on Feb. 22, 2024; 8 pages.

(Continued)

*Primary Examiner* — Laura M Menz
(74) *Attorney, Agent, or Firm* — Francois Pagette

(57) ABSTRACT

A semiconductor device is provided. The semiconductor device includes a substrate, a gate electrode, an isolation structure, and an electrode plate. The gate electrode is over the substrate and the isolation structure is in contact with the gate electrode. The electrode plate is in the isolation structure.

17 Claims, 5 Drawing Sheets

(56) References Cited

U.S. PATENT DOCUMENTS

| | | | | |
|---|---|---|---|---|
| 2008/0299722 A1* | 12/2008 | Hartwich | ............. | H10D 64/513 |
| | | | | 257/E21.655 |
| 2013/0207174 A1* | 8/2013 | Wang | ................... | H10D 64/035 |
| | | | | 438/257 |
| 2014/0264523 A1* | 9/2014 | Loechelt | ................ | H10B 12/37 |
| | | | | 438/386 |
| 2015/0371893 A1* | 12/2015 | Chou | .................. | H10P 90/1906 |
| | | | | 257/621 |
| 2017/0092650 A1* | 3/2017 | Chen | ................. | H10D 30/0413 |
| 2019/0006458 A1* | 1/2019 | Chan | ....................... | H10D 1/692 |
| 2019/0189803 A1* | 6/2019 | Kloster | ............. | H10D 30/6211 |
| 2020/0081185 A1* | 3/2020 | Chang | ................. | G02B 6/1228 |
| 2021/0036100 A1* | 2/2021 | Lu | .......................... | H10D 1/042 |
| 2023/0126794 A1* | 4/2023 | Liu | ........................ | H10D 1/665 |
| | | | | 257/506 |
| 2024/0014278 A1* | 1/2024 | Tsai | ....................... | H10D 30/63 |
| 2024/0120373 A1* | 4/2024 | Yu | ........................ | H10D 62/115 |
| 2024/0234448 A1* | 7/2024 | Pritchard | ............... | H10D 1/042 |
| 2024/0363652 A1* | 10/2024 | Chang | ................... | H10D 1/696 |
| 2025/0157915 A1* | 5/2025 | Villalon | ................ | H10W 20/42 |
| 2025/0218915 A1* | 7/2025 | Acikalin | ............... | H10W 70/65 |

FOREIGN PATENT DOCUMENTS

| | | | | | | |
|---|---|---|---|---|---|---|
| CN | 101064282 A | * | 10/2007 | | | |
| CN | 118315376 A | * | 7/2024 | ........... | H10D 86/201 |
| DE | 102020107441 A1 | * | 9/2021 | ........... | H10D 84/212 |
| EP | 4398701 A1 | * | 7/2024 | ........... | H10D 86/201 |
| JP | 2004040095 A | * | 2/2004 | ....... | H01L 21/76232 |
| KR | 100299342 B1 | * | 10/2001 | ......... | H10B 12/0387 |
| KR | 20240162770 A | * | 11/2024 | ....... | H01L 21/76877 |

OTHER PUBLICATIONS

U.S. Appl. No. 18/045,799, filed Oct. 11, 2022, Yu et al.

* cited by examiner

LATERAL CAPACITORS OF SEMICONDUCTOR DEVICES

TECHNICAL FIELD

The present disclosure relates generally to semiconductor devices, and more particularly to lateral capacitors of semiconductor devices and methods of forming the same.

BACKGROUND

Technological advances in the semiconductor integrated circuit (IC) industry have brought about ever-decreasing sized IC chips with a higher density of semiconductor devices. Miniaturization, or the downsizing, of the semiconductor devices in the IC chips has been the key to achieving overall device improvements.

In order to meet the growing needs of the semiconductor industry, semiconductor devices enabling further device miniaturization to form highly functional IC chips on a smaller chip area, and methods of forming the same are provided.

SUMMARY

To achieve the foregoing and other aspects of the present disclosure, lateral capacitors of semiconductor devices and methods of forming the same are presented.

According to an aspect of the present disclosure, a semiconductor device is provided. The semiconductor device includes a substrate, a gate electrode, an isolation structure, and an electrode plate. The gate electrode is over the substrate and the isolation structure is in contact with the gate electrode. The electrode plate is in the isolation structure.

According to another aspect of the present disclosure, a semiconductor device is provided. The semiconductor device includes a substrate, a first gate electrode, a second gate electrode, an isolation structure, a first electrode plate, and a second electrode plate. The first gate electrode and the second gate electrode are over the substrate. The isolation structure is in contact with the first electrode and the second gate electrode. The first electrode plate and the second electrode plate are in the isolation structure and spaced apart from each other.

According to yet another aspect of the present disclosure, a method of forming a semiconductor device is provided. The method includes forming a layer of gate electrode material over a substrate and forming a trench through the layer of gate electrode material. The trench is formed partially into the substrate and divides the layer of gate electrode material into a first gate electrode and a second gate electrode at laterally adjacent sides thereof. An isolation structure is formed in the trench and an electrode plate is formed in the isolation structure.

BRIEF DESCRIPTION OF THE DRAWINGS

The embodiments of the present disclosure will be better understood from a reading of the following detailed description, taken in conjunction with the accompanying drawings.

Figure 1A:
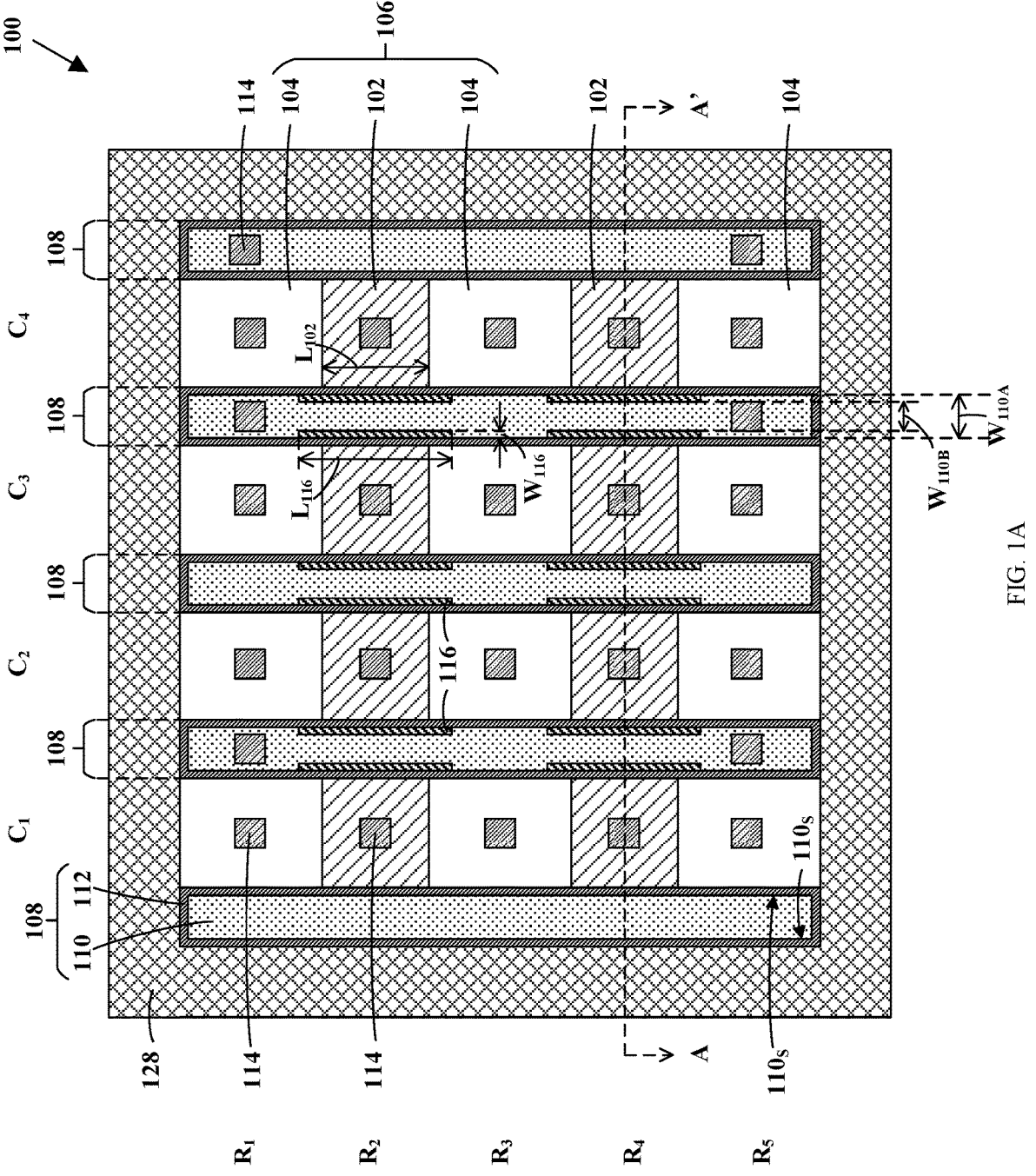
FIG. 1A illustrates a top-down view of a semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure.

Additionally, features in the drawings are not necessarily drawn to scale. For example, the dimensions of some of the features in the drawings may be exaggerated relative to other features to help improve the understanding of the embodiments of the device. The same reference numerals in different drawings denote the same features, while similar reference numerals may but do not necessarily, denote similar features.

DETAILED DESCRIPTION

The present disclosure relates to lateral capacitors of semiconductor devices and methods of forming the same. Various embodiments of the present disclosure are now described in detail with accompanying drawings. It is noted that like and corresponding features are referred to by the use of the same reference numerals. The embodiments disclosed herein are exemplary, and not intended to be exhaustive or limiting to the disclosure.

FIG. 1A is a top-down view of a semiconductor device 100, according to an embodiment of the disclosure. The semiconductor device 100 may include a plurality of gate electrodes 102 and a plurality of doped structures 104 arranged in an array configuration of rows and columns. For example, the array may include five rows $R_1$ through $R_5$ by four columns $C_1$ through $C_4$. The plurality of doped structures 104 may be arranged in odd-numbered rows $R_1$, $R_3$, and $R_5$, while the plurality of gate electrodes 102 may be arranged in even-numbered rows $R_2$ and $R_4$.

Each column, $C_1$ through $C_4$, may include a gate electrode 102 between a pair of doped structures 104. For example, in column $C_1$, three doped structures 104 and two gate electrodes 102 are arranged in an alternating configuration of a doped structure 104 and a gate electrode 102. Each doped structure 104 may serve as either a drain region or a source region, and along with the gate electrode 102 therebetween, function as a transistor 106. Accordingly, the gate electrode 102 has a gate length L extending between the doped structures 104. Even though FIG. 1A illustrates the array as such, the plurality of gate electrodes 102 and the plurality of doped structures 104 may take on other array configurations without departing from the spirit and scope of the present disclosure.

Each gate electrode 102 may include one or more electrically conductive layers, for example, polycrystalline silicon, amorphous silicon, tantalum, hafnium, copper, silver, cobalt, tungsten, or combinations thereof. In an embodiment of the disclosure, each gate electrode 102 may further include a silicided conductive material, for example, silicided silicon. Each doped structure 104 may include a semiconductor material, for example, silicon or silicon germanium, and the semiconductor material may be doped with appropriate dopants.

The semiconductor device 100 may further include a plurality of isolation structures 108. The isolation structures 108 may be at least interposed between columns $C_1$ through $C_4$ and serve to isolate columns $C_1$ through $C_4$ from each other at least electrically. For example, an isolation structure 108 may be arranged between columns $C_1$ and $C_2$, and electrically isolate column $C_1$ from column $C_2$. Each isolation structure 108 may traverse rows $R_1$ through $R_5$. The isolation structure 108 may be in contact with the gate electrodes 102 and the doped structures 104 in laterally adjacent columns. For example, the isolation structure 108 that separates column $C_2$ from column $C_3$ may isolate the gate electrodes 102 and the doped structures 104 in their corresponding columns $C_2$ and $C_3$ from each other at least electrically.

Each isolation structure 108 may include a dielectric core 110 and a dielectric liner 112 surrounding the dielectric core 110 at least laterally. The dielectric liner 112 may be conformal and may be arranged on at least the laterally adjacent side surfaces $110_S$ of the dielectric core 110 that are in contact with the gate electrodes 102 and the doped structures 104. The dielectric core 110 may include a dielectric material, for example, silicon dioxide. The dielectric liner 112 may include a different dielectric material from the dielectric core 110, preferably a dielectric material having a higher dielectric constant than the dielectric core 110, for example, silicon nitride or silicon oxynitride.

The semiconductor device 100 may yet further include a plurality of contact structures 114. The contact structures 114 may be arranged over each gate electrode 102 and each doped structure 104. The contact structures 114 may also be arranged in the isolation structures 108. The number of contact structures 114 in the isolation structures 108 may vary depending on the design requirements of the semiconductor device 100. For example, as illustrated, two contact structures 114 may be arranged in the isolation structure 108 separating column $C_1$ from column $C_2$ and the isolation structure 108 separating column $C_3$ from column $C_4$. However, some isolation structures 108 may not include the contact structures 114 therein, for example, the isolation structure 108 that separates column $C_2$ from column $C_3$. In another example, all isolation structures 108 in the semiconductor device 100 do not include any contact structures 114. Each contact structure 114 may include an electrically conductive material, for example, copper or tungsten. In an embodiment of the disclosure, the contact structures 114 may be line structures and/or via structures.

The semiconductor device 100 may additionally include a plurality of electrode plates 116 in the isolation structures 108. Each electrode plate 116 may include a planar structure having a length $L_{116}$ and a substantially uniform width $W_{116}$; the length $L_{116}$ taken parallel to the gate length $L_{102}$ and the width $W_{116}$ taken perpendicular to and at the same plane as the length $L_{116}$. In an embodiment of the disclosure, the length $L_{116}$ of the electrode plate 116 may be at least as long as the gate length $L_{102}$.

The number of electrode plates 116 in the isolation structures 108 may vary depending on the design requirements of the semiconductor device 100. For example, as illustrated, each gate electrode 102 may have at least one electrode plate 116 arranged laterally adjacent thereto, though not necessarily so.

The electrode plate 116 may be arranged directly on the dielectric liner 112 laterally adjacent to the gate electrode 102 such that the electrode plate 116 may be in contact with the dielectric liner 112 and the dielectric core 110. The portion of the dielectric liner 112 in contact with the electrode plate 116 may be at least in contact with the laterally adjacent gate electrode 102. As further illustrated, a pair of electrode plates 116 may be arranged in the isolation structure, and the pair of electrode plates 116 may be spaced apart from each other by the dielectric core 110.

The presence of the electrode plate 116 in the isolation structure 108 may result in different width dimensions of the corresponding dielectric core 110 therein; the width of the dielectric core 110 is taken to the substantially parallel to the width $W_{116}$ of the electrode plate 116. For example, the dielectric core 110 may have a width $W_{110A}$ extending between opposite side surfaces that are in contact with the dielectric liner 112, and a width $W_{110B}$ narrower than the width $W_{110A}$ extending between opposite side surfaces that at least one side surface thereof is in contact with an electrode plate 116.

A lateral capacitor in the semiconductor device 100 may result. The electrode plate 116 may serve as a first capacitor electrode, the gate electrode 102 may serve as a second capacitor electrode, and the dielectric liner 112 laterally between the gate electrode 102 may serve as a capacitor dielectric of the lateral capacitor.

Figures 1B, 2:
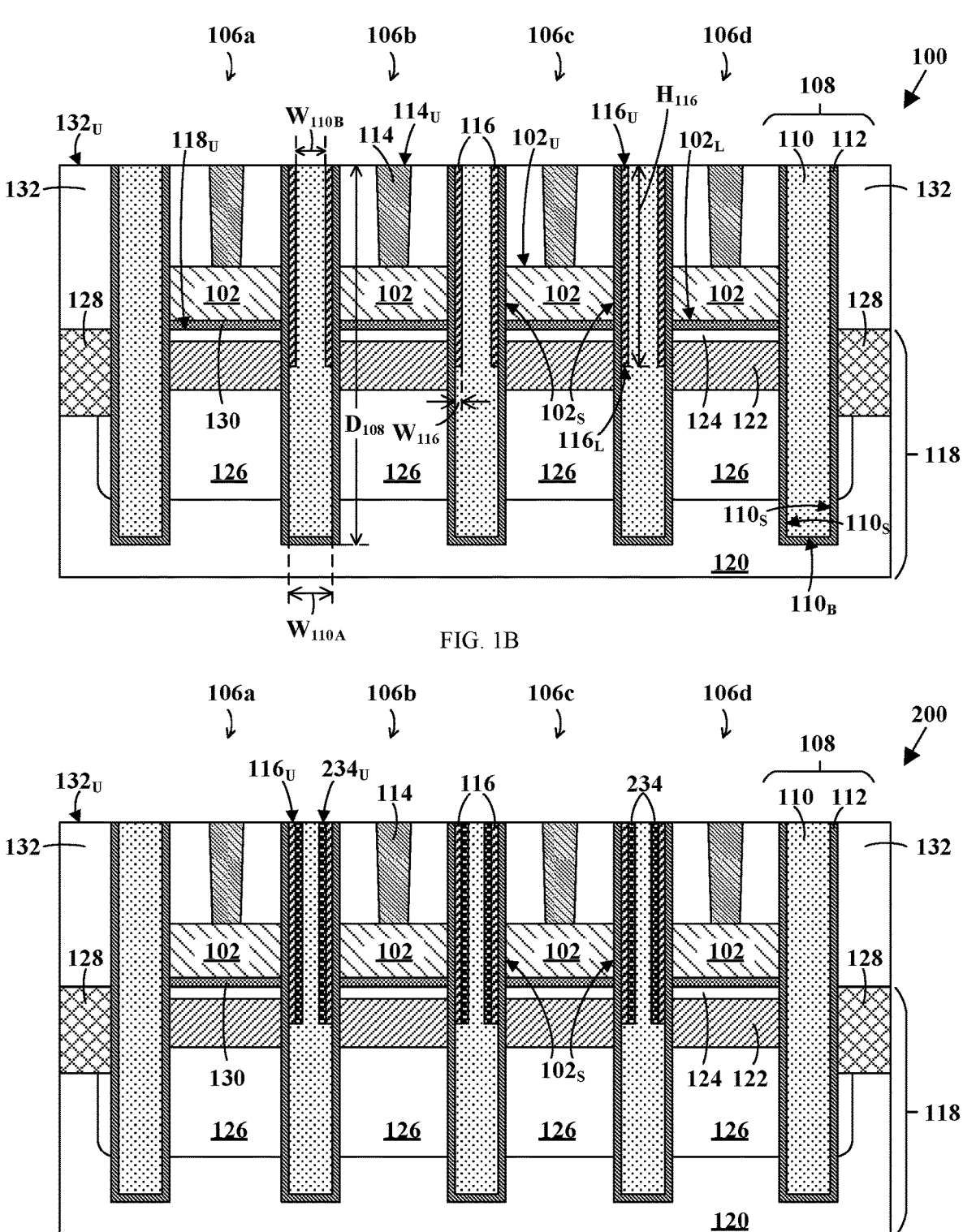
FIG. 1B illustrates a cross-sectional view of the semiconductor device in FIG. 1A, taken generally along a line A-A, according to an embodiment of the disclosure.
FIG. 2 illustrates a cross-sectional view of a semiconductor device, according to another embodiment of the disclosure.

FIG. 1B is a cross-sectional view of the semiconductor device 100, taken generally along line A-A' in FIG. 1A, according to an embodiment of the disclosure. The semiconductor device 100 may be arranged in and over a substrate 118. The substrate 118 has an upper substrate surface $118_U$. The substrate 118 may be a bulk semiconductor substrate. Alternatively, the substrate 118 may be a composite substrate, such as a semiconductor-on-insulator (SOI) substrate having a bulk layer 120, a buried insulator layer 122 over the bulk layer 120, and a semiconductor layer 124 over the buried insulator layer 122.

The bulk layer 120 and the semiconductor layer 124 may include a semiconductor material, for example, silicon, germanium, silicon germanium, silicon carbide, or other II-VI or III-V semiconductor compounds, though not necessarily the same semiconductor material. The bulk layer 120 and the semiconductor layer 124 may be doped or undoped. The semiconductor layer 124 may also be referred to as a device layer or an active layer of the semiconductor device 100. The buried insulator layer 122 may serve to isolate the semiconductor layer 124 from the bulk layer 120 at least electrically. The buried insulator layer 122 may include an electrically insulating material, for example, silicon dioxide or aluminum oxide, and may also be referred to as a buried oxide (BOX) layer.

The semiconductor device 100 may further include a plurality of doped regions 126 in the bulk layer 120 of the substrate 118. Each doped region 126 may be arranged vertically under a corresponding gate electrode 102 and may provide either n-type conductivity or p-type conductivity. The designation of "n-type" or "p-type" is based on the type of dopant and its conductivity in each doped region 126. For example, n-type conductivity may be provided by n-type dopants, such as arsenic, phosphorus, or antimony, and p-type conductivity may be provided by p-type dopants, such as boron, aluminum, or gallium. Each gate electrode 102 may have an upper surface $102_U$, a lower surface $102_L$, and laterally opposite side surfaces $102_S$.

Each doped region 126 may not necessarily include the same conductivity, the same dopants, or the same dopant concentration from an immediately adjacent doped region 126. For example, each doped region 126 may include a different conductivity from an immediately adjacent doped region 126. In another example, each doped region 126 may include the same conductivity as an immediately adjacent doped region 126.

The plurality of transistors 106 may operate under different modes and may include n-type transistors, p-type transistors, or a combination of n-type transistors and p-type transistors. For example, as illustrated, the semiconductor device 100 may include four transistors 106a, 106b, 106c, and 106d, and each transistor 106a, 106b, 106c, and 106d is either an n-type transistor or a p-type transistor. In an embodiment of the disclosure, the transistor 106a may operate under the same mode as the immediately adjacent transistor 106b, for example, the transistor 106a and the transistor 106b are n-type transistors or p-type transistors. In another embodiment of the disclosure, the transistor 106a may operate under a different mode from the immediately adjacent transistor 106b, for example, the transistor 106a is an n-type transistor and the transistor 106b is a p-type transistor, or vice versa.

Depending on the modes of operation of the transistors 106, the corresponding doped regions 126 under the respective gate electrodes 102 may include different conductivities, either n-type conductivity or p-type conductivity. For example, where an n-type transistor is desired, the doped region 126 vertically under the corresponding gate electrode 102 has p-type conductivity. In another example, where a p-type transistor is desired, the doped region 126 vertically under the corresponding gate electrode 102 has n-type conductivity.

The semiconductor device 100 may also include a trench isolation structure 128. The trench isolation structure 128 may surround the array of gate electrodes 102 and doped structures 104, as illustrated in FIG. 1A. The trench isolation structure 128 may extend at least through the semiconductor layer 124. For example, the trench isolation structure 128 may terminate within the bulk layer 120, as illustrated in FIG. 1B. In another example, the trench isolation structure 128 may terminate within the buried insulator layer 122 of the substrate 118. In an embodiment of the disclosure, the trench isolation structure 128 may also be referred to as a shallow trench isolation (STI) structure.

A plurality of gate insulating layers 130 may be arranged between the gate electrodes 102 and the substrate 118. For example, each transistor 106a, 106b, 106c, or 106d may include a gate insulating layer 130 arranged under their corresponding gate electrode 102, among other things. The gate insulating layers 130 may include an electrically insulative material, for example, silicon dioxide, or an electrically insulative material having a dielectric constant higher than silicon dioxide, for example, hafnium dioxide.

A dielectric layer 132 may be arranged over the substrate 118, the gate electrodes 102, and the trench isolation structure 128. The dielectric layer 132 may include an upper dielectric surface $132_U$. The dielectric layer 132 may include an electrically insulative material, for example, silicon dioxide, carbon-doped silicon dioxide, tetraethoxysilane (TEOS), borophosphosilicate glass (BPSG), undoped silicate glass (USG), or amorphous silicon. The dielectric layer 132 may be referred to as a pre-metal dielectric layer.

An upper portion of each isolation structure 108 may be arranged in the dielectric layer 132, while a lower portion thereof may be arranged in the substrate 118. Each isolation structure 108 may extend from the upper dielectric surface $132_U$ of the dielectric layer 132 and terminate within the substrate 118 with a depth $D_{108}$. In an embodiment of the disclosure, the isolation structures 108 may extend through the doped regions 126 and terminate within the bulk layer 120 of the substrate 118, as illustrated in FIG. 1B. In another embodiment of the disclosure, the isolation structures 108 may terminate within the plurality of doped regions 126, even though this embodiment is not illustrated in the accompanying drawings.

As mentioned above, each isolation structure 108 may include a dielectric core 110 and a dielectric liner 112 surrounding the dielectric core 110. The dielectric liner 112 may be conformal and may be arranged on at least the side surfaces $110_S$ of the dielectric core 110. In an embodiment of the disclosure, the dielectric liner 112 may be continuous, lining the side surfaces $110_S$ and a base $110_B$ of the dielectric core 110, acquiring a "U-shaped" profile.

The contact structures 114 may be arranged in the dielectric layer 132 and the isolation structures 108, and may have upper surfaces $114_U$ substantially coplanar with each other. The upper surfaces $114_U$ of the contact structures 114 may be substantially coplanar with the upper dielectric surface $132_U$ of the dielectric layer 132.

The contact structures 114 in the dielectric layer 132 may be arranged over the gate electrodes 102, the doped structures 104, and in the isolation structures 108, as illustrated in FIG. 1A. The contact structures 114 over the gate electrodes 102 may extend from the upper surface $114_U$ thereof to the upper surface $102_U$ of the gate electrodes 102. Even though not illustrated in the accompanying drawings, the contact structures 114 over the doped structures 104 may extend from the upper surface $114_U$ thereof to the upper surface of the doped structures 104, and the contact structures 114 in the isolation structures 108 may extend to at least the same depth as the contact structures 114 in the dielectric layer 132 relative to the upper surfaces $114_U$.

The electrode plates 116 may extend vertically in the isolation structures 108. Each electrode plate 116 may have an upper portion over the upper substrate surface $118_U$ and a lower portion under the upper substrate surface $118_U$. Each electrode plate 116 has an upper surface $116_U$, a lower surface $116_L$, and the electrode plate 116 has a height $H_{116}$ extending between the upper surface $116_U$ and a lower surface $116_L$ thereof. The upper surface $116_U$ of the electrode plate 116 may be substantially coplanar with the upper dielectric surface $132_U$ of the dielectric layer 132, and the lower surface $116_L$ of the electrode plate 116 may at least extend to a level substantially coplanar with the lower surface $102_L$ of the gate electrode 102. For example, as illustrated, the lower surface $116_L$ of the electrode plate 116 may extend to a level within the buried insulator layer 122 such that a portion of the dielectric core 110 may be under the electrode plate 116.

As the length $L_{116}$ of the electrode plate 116 may be at least as long as the gate length $L_{102}$ and the height $H_{116}$ of the electrode plate 116 may be greater than the height of the gate electrode 102, the electrode plate 116 may have a side surface area larger than a side surface area of the gate electrode 102.

FIG. 2 illustrates a cross-sectional view of a semiconductor device 200, according to another embodiment of the disclosure. The semiconductor device 200 may be similar to the semiconductor device 100, and thus common features are labeled with the same reference numerals and need not be separately discussed.

The semiconductor device 200 may include a dielectric layer 234 in the isolation structures 108. The dielectric layer 234 may extend vertically in the isolation structure 108 and contact the electrode plate 116 therein. For example, the dielectric layer 234 may be laterally between the electrode plate 116 and the dielectric core 110 of the isolation structure 108. The dielectric layer 234 may include a voltage-controllable dielectric material, for example, hafnium dioxide, and may serve as a lateral variable capacitance diode or lateral varactor diode.

The dielectric layer 234 may have an upper surface $234_U$ substantially coplanar with the upper surface $116_U$ of the electrode plate, and the dielectric layer 234 may extend to a substantially similar height in the isolation structure 108 as the electrode plate 116. For example, the height of the dielectric layer 234 may be substantially similar to the height $H_{116}$ of the electrode plate 116. Accordingly, a portion of the dielectric core 110 may be arranged under the dielectric layer 234. Additionally, the dielectric layer 234 may or may not have a similar length and width as the length $L_{116}$ and width $W_{116}$ of the electrode plate 116, even though FIG. 2 illustrates the dielectric layer 234 to have a substantially similar width. For example, the spatial dimensions of the electrode plate 116 and the dielectric layer 234 may vary due to optimization to achieve the desired electrical characteristics of the semiconductor device 200.

Figure 3:
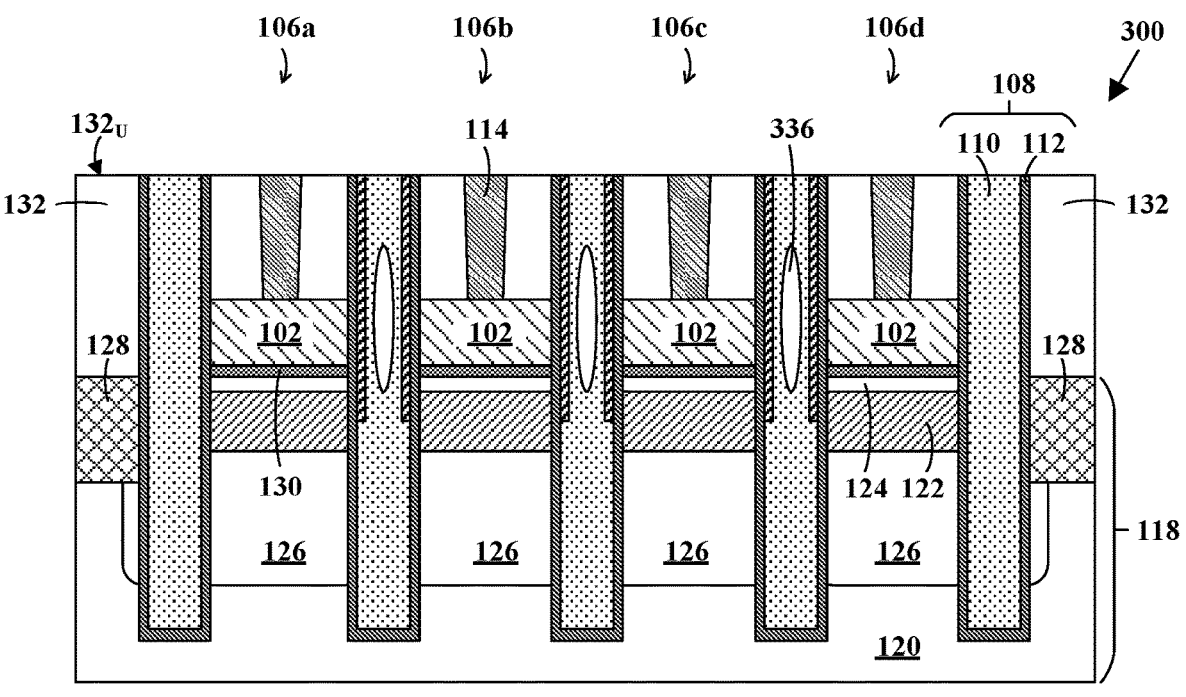
FIG. 3 illustrates a cross-sectional view of a semiconductor device, according to yet another embodiment of the disclosure.

FIG. 3 illustrates a cross-sectional view of a semiconductor device 300, according to yet another embodiment of the disclosure. The semiconductor device 300 may be similar to the semiconductor device 100, and thus common features are labeled with the same reference numerals and need not be separately discussed.

The semiconductor device 300 may include a void 336 in the isolation structures 108. The void 336 may be entirely within the dielectric core 110, i.e., the void 336 may be collectively surrounded by the dielectric core 110 from above, under, and laterally, which fully seals the void 336. The void 336 may be filled with air and may be referred to as an air gap. The void 336 may contain a gas at or near atmospheric pressure, or at sub-atmospheric pressure, for example, a partial vacuum. The elemental composition of the gas in the void 336 can include different gases and should not be construed as having any particular elemental composition, for example, any number and type of gases may be present in the void 336 as defined by the dielectric core 110. The void 336 as defined by the dielectric core 110 may be characterized by a permittivity or a dielectric constant of near unity, for example, vacuum permittivity. The permittivity of the void 336 may be less than the dielectric constant of the surrounding solid material, such as the dielectric core 110.

FIGS. 4A to 4E are cross-sectional views of the semiconductor device 100, illustrating a processing method of forming the electrode plates 116 therein, according to an embodiment of the disclosure. Certain structures may be conventionally fabricated, for example, using known processes and techniques, and specifically disclosed processes and methods may be used to achieve individual aspects of the present disclosure.

Figure 4A:
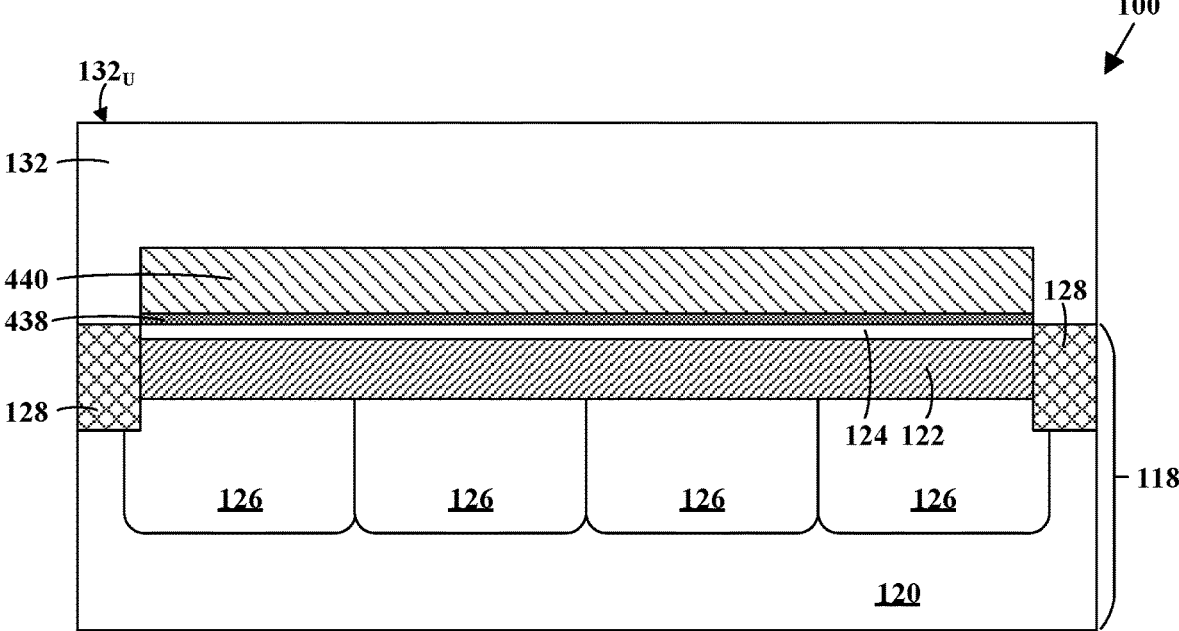
FIGS. 4A to 4E are cross-sectional views of the semiconductor device in FIG. 1B, illustrating a processing method of forming a lateral capacitor therein, according to an embodiment of the disclosure.

FIG. 4A illustrates the semiconductor device 100 at an initial fabrication stage of a processing method, according to an embodiment of the disclosure. Depending on the design requirements of the semiconductor device 100 and the type of transistors to be formed, at least one doped region 126 may be formed in the bulk layer 120 of the substrate 118. For example, as illustrated, four doped regions 126 may be formed in the bulk layer 120 of the substrate 118. The doped regions 126 may be formed by introducing dopants using a doping technique, for example, an ion-implantation process. The doped regions 126 may not necessarily include the same conductivity, the same dopants, or the same dopant concentration as an immediately adjacent doped region 126.

A trench isolation structure 128 may be used to define regions where various semiconductor devices may be formed therein and thereupon the substrate 118. The trench isolation structure 128 may be formed using a patterning technique, including lithography and etching processes, to form a trench (not shown) in the substrate 118. The trench may at least extend through the semiconductor layer 124 of the substrate 118. Subsequently, the trench may be filled with an electrically insulative material, for example, silicon dioxide.

A layer of gate insulating material 438 and a layer of gate electrode material 440 may be sequentially deposited over the substrate 118. The layer of gate insulating material 438 and the layer of gate electrode material 440 may be deposited using a deposition technique, including a chemical vapor deposition (CVD) process or a physical vapor deposition (PVD) process, and subsequently patterned using a patterning technique, including lithography and etching processes.

Although not shown in FIG. 4A, doped structures may be formed at laterally opposite sides of the layer of gate electrode material 440; the doped structures are into and out of the page of the accompanying drawings and are synonymous with the doped structures 104 in FIG. 1A. In an embodiment of the disclosure, the doped structures may be formed in the semiconductor layer 124 of the substrate 118 by a doping technique, including an ion implantation process. In another embodiment of the disclosure, the doped structures may be formed by a deposition technique, including an epitaxial process, and the dopants may be introduced into the doped structures by a doping technique, including an ion implantation process, or during the deposition technique by an in-situ process.

A dielectric layer 132 may be deposited over the substrate 118, the trench isolation structure 128, the layer of gate electrode material 440, and the doped structures. The dielectric layer 132 may be deposited using a deposition technique, including a CVD process. The dielectric layer 132 has an upper dielectric surface $132_U$.

Figure 4B:
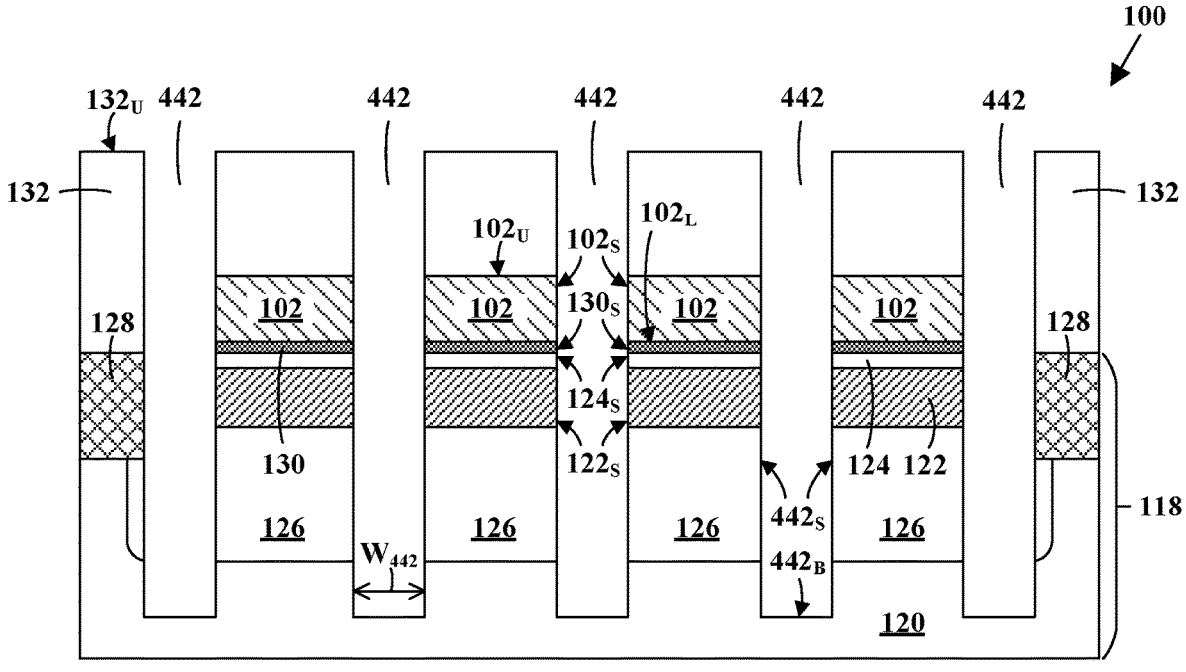

FIG. 4B is a cross-sectional view of the semiconductor device 100 at a fabrication stage subsequent to FIG. 4A, according to an embodiment of the disclosure. Trenches 442 may be formed partially through the substrate 118. Each trench 442 has a base $442_B$ and laterally opposite side surfaces $442_S$, and a width $W_{442}$ between the side surfaces $442_S$.

The trenches 442 may extend from the upper dielectric surface $132_U$ of the dielectric layer 132 to a level within the substrate 118. For example, the trenches 442 may at least extend through the layer of gate electrode material 440 and the layer of gate insulating material 438, and consequently divide the layer of gate electrode material 440 and the layer of gate insulating material 438 into a plurality of gate electrodes 102 and a plurality of gate insulating layers 130, respectively. The trenches 442 may be formed using a patterning technique, including lithography and etching processes.

Each side surface $442_S$ of the trenches 442 may expose and include the side surface $102_S$ of the gate electrode 102, the side surface $130_S$ of the gate insulating layer 130, the side surface $124_S$ of the semiconductor layer 124 of the substrate 118, and the side surface $122_S$ of the buried insulator layer 122 of the substrate 118. A portion of the substrate 118 may be exposed in the lower portion of each trench 338. In an embodiment of the disclosure, the side surface $102_S$, the side surface $130_S$, the side surface $124_S$, and the side surface $122_S$ may be substantially coplanar with each other.

As mentioned above, the doped structures that are synonymous with the doped structures 104 in FIG. 1 may be formed at laterally opposite sides of the layer of gate electrode material 440 (into and out of the page of the accompanying drawings). The trenches 442 may also extend through the doped structures during the patterning technique.

Figure 4C:
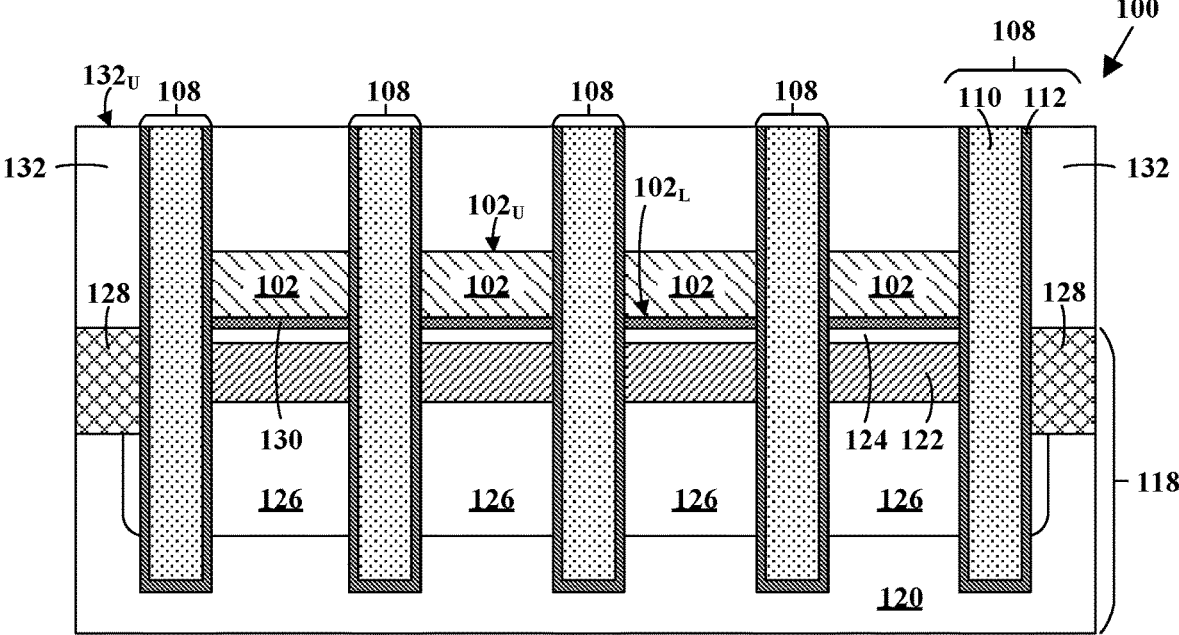

FIG. 4C is a cross-sectional view of the semiconductor device 100 at a fabrication stage subsequent to FIG. 4B, according to an embodiment of the disclosure. A dielectric liner 112 and a dielectric core 110 may be formed in the trenches 442.

A layer of dielectric liner material may be conformally deposited in the trenches 442, lining the side surfaces $442_S$ and the base $442_B$ thereof. The layer of dielectric liner material may be continuous and in contact with the side surfaces $102_S$ of the gate electrodes 102, the side surfaces $130_S$ of the gate insulating layers 130, the side surfaces $124_S$ of the semiconductor layer 124, and the side surfaces $122_S$ of the buried insulator layer 122. The layer of dielectric liner material may further overlay the upper dielectric surface $132_U$ of the dielectric layer 132.

A layer of dielectric core material may be subsequently deposited over the layer of dielectric liner material to at least fill the trenches 442. The layer of dielectric liner material and the layer of dielectric core material may be deposited using a deposition technique, including a CVD process. The layer of dielectric liner material and the layer of dielectric core material may be subsequently planarized using a planarization technique, including a chemical-mechanical planarization (CMP) process, to form the dielectric liner 112 and the dielectric core 110, respectively, in the trenches 442. The planarization technique also achieves the formation of the upper surfaces of the dielectric liner 112 and the dielectric core 110 to be substantially coplanar with each other, and also with the upper dielectric surface $132_U$ of the dielectric layer 132.

The dielectric liner 112 and the dielectric core 110 may form an isolation structure 108 in each trench 442. In an embodiment of the disclosure, the upper surface of the dielectric liner and the dielectric core may be substantially coplanar with the upper dielectric surface $132_U$ of the dielectric layer 132.

Figure 4D:
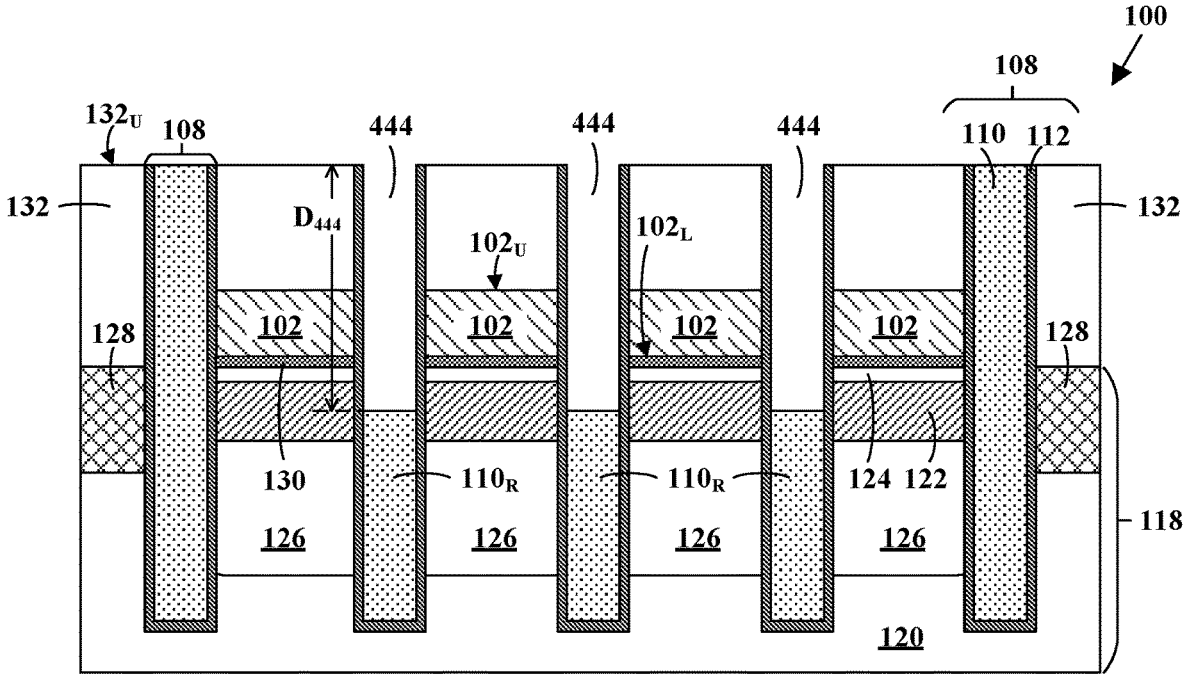

FIG. 4D is a cross-sectional view of the semiconductor device 100 at a fabrication stage subsequent to FIG. 4C, according to an embodiment of the disclosure. Openings 444 may be formed in the isolation structures 108 using a patterning technique, including lithography and etching processes.

The dielectric cores 110 may be recessed to a depth $D_{444}$ and resulting recessed dielectric cores $110_R$ may be formed under the openings 444. Each opening 444 may have side surfaces defined by the exposed portions of the dielectric liner 112 and a base defined by an upper surface of the recessed dielectric core $110_R$; the exposed portions of the dielectric liner 112 may define lateral boundaries of the opening 444. The depth $D_{444}$ may at least extend to a level substantially coplanar with the lower surface $102_L$ of the gate electrode 102. As illustrated, the depth $D_{444}$ extends to a level within the buried insulator layer 122. electrode plate 116.

Figure 4E:
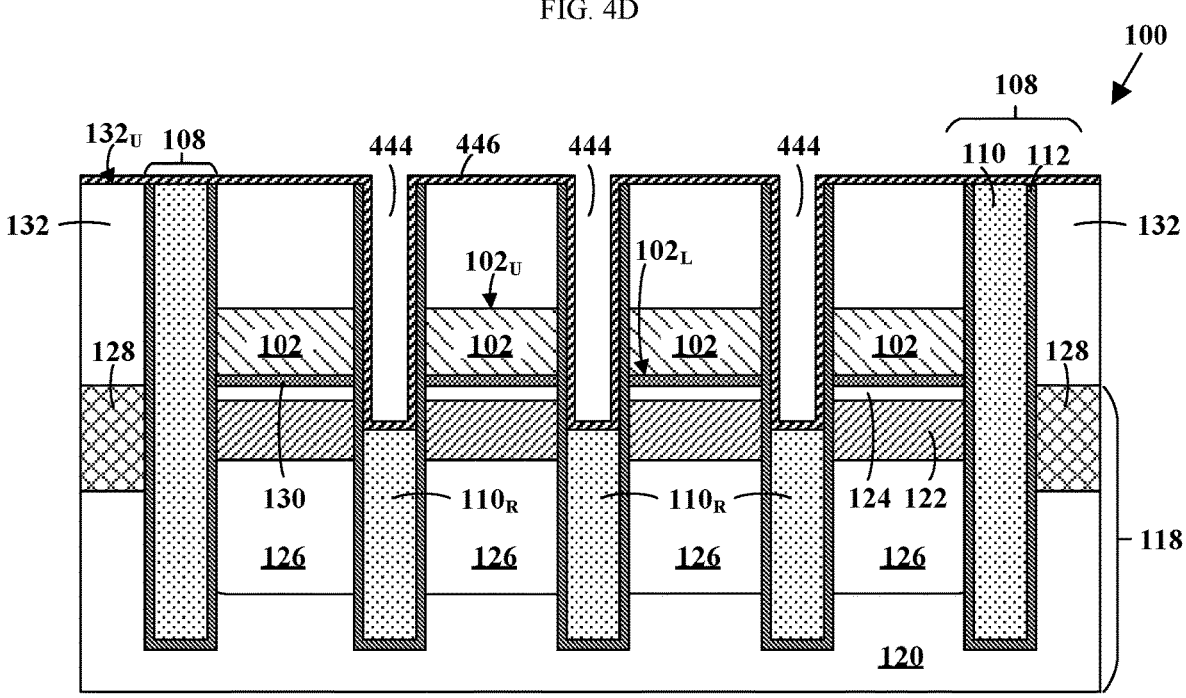

FIG. 4E is a cross-sectional view of the semiconductor device 100 at a fabrication stage subsequent to FIG. 4D, according to an embodiment of the disclosure. A layer of electrode material 446 may be conformally deposited in each opening 444, lining the exposed portion of the dielectric liner 112 and the upper surface of the recessed dielectric core $110_R$. The layer of electrode material 446 may further overlay the upper dielectric surface $132_U$ of the dielectric layer 132.

Portions of the layer of electrode material 446 may be removed using a material removal technique, for example, an anisotropic etching process. The portions of the layer of electrode material 446 overlying the upper dielectric surface $132_U$ of the dielectric layer 132 and the upper surface of the recessed dielectric core $110_R$ may be removed, leaving behind a portion of the electrode material on the dielectric liner 112, forming the electrode plates 116 thereon.

Processing continues with the filling of the remaining portion of the openings 444 with a dielectric material using a deposition technique. Contact structures 114 may be subsequently formed over the gate electrodes 102, in the isolation structures 108, and over the doped structures.

As presented above, various embodiments of lateral capacitors of semiconductor devices and methods of forming the same are presented. The lateral capacitors arranged in the isolation structures enable the formation of a compact semiconductor device including closely packed transistors to achieve further miniaturization of IC chips while delivering greater device performance. The contact structures arranged in the isolation structures may improve the electrical routing of the semiconductor devices.

The terms "top", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of features is not necessarily limited to those features but may include other features not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about," or "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of 90 degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of features and methods of fabrication described in an exemplary embodiment without departing from the scope of this disclosure as set forth in the appended claims.

What is claimed is:

1. A semiconductor device for a lateral capacitor, comprising:
   a substrate;
   a gate electrode over the substrate;
   an isolation structure comprising:
      a dielectric core having laterally opposite side surfaces; and
      a dielectric liner laterally surrounding the dielectric core, wherein at least a portion of the dielectric liner is in direct physical contact with a sidewall of the gate electrode; and
   an electrode plate within the isolation structure, wherein the electrode plate is between the dielectric liner and the dielectric core.

2. The semiconductor device of claim 1, wherein the electrode plate extends vertically along the isolation structure.

3. The semiconductor device of claim 2, wherein the substrate has an upper substrate surface, and the electrode plate has a first portion over the upper substrate surface and a second portion under the upper substrate surface.

4. The semiconductor device of claim 1, wherein the electrode plate is laterally spaced apart from the gate electrode by the dielectric liner.

5. The semiconductor device of claim 1, wherein a portion of the dielectric core is under the electrode plate.

6. The semiconductor device of claim 1, further comprising:
   a dielectric layer over the gate electrode, the dielectric layer has an upper dielectric surface and the electrode plate has an upper surface substantially coplanar with the upper dielectric surface.

7. The semiconductor device of claim 6, further comprising:
   a contact structure in the dielectric layer, the contact structure having an upper surface substantially coplanar with the upper surface of the electrode plate.

8. The semiconductor device of claim 1, wherein the gate electrode is a first gate electrode and the electrode plate is a first electrode plate, further comprising:
   a second gate electrode over the substrate, the second gate electrode is laterally adjacent to the first gate electrode, and the isolation structure is in contact with the first gate electrode and the second gate electrode; and
   a second electrode plate in the isolation structure spaced apart from the first electrode plate, wherein the first electrode plate and the second electrode plate are between the dielectric liner and the dielectric core.

9. The semiconductor device of claim 8, wherein the first electrode plate is spaced apart from the second electrode plate by the dielectric core.

10. The semiconductor device of claim 9, wherein the dielectric core has a first width extending between opposite side surfaces contacting the dielectric liner and a second width extending between opposite side surfaces contacting the first electrode plate and the second electrode plate, and the second width is narrower than the first width.

11. The semiconductor device of claim 9, wherein the first electrode plate is on a portion of the dielectric liner, and the portion of the dielectric liner is at least in contact with the first gate electrode.

12. The semiconductor device of claim 8, wherein the first electrode plate has a side surface area, the first gate electrode has a side surface area, and the side surface area of the first electrode plate is at least as large as the side surface area of the first gate electrode.

13. The semiconductor device of claim 8, wherein the second electrode plate has an upper portion over the substrate and a lower portion in the substrate.

14. A method of forming a semiconductor device for a lateral capacitor, comprising:
   forming a layer of gate electrode material over a substrate;
   forming a trench through the layer of gate electrode material partially into the substrate, the trench divides the layer of gate electrode material into a first gate electrode and a second gate electrode at laterally adjacent sides thereof;
   forming an isolation structure within the trench, wherein forming the isolation structure comprises:
      a dielectric core having laterally opposite side surfaces; and
      a dielectric liner laterally surrounding the dielectric core, wherein at least a portion of the dielectric liner is in direct physical contact with a sidewall of the gate electrode; and
   forming an electrode plate in the isolation structure, wherein the electrode plate is between the dielectric liner and the dielectric core.

15. The method of claim 14, wherein forming the isolation structure comprises:
   forming a first dielectric material to partially fill the trench, the first dielectric material is conformal to the trench and in contact with the first gate electrode and the second gate electrode;
   forming a second dielectric material to at least fill the trench, the second dielectric material is different from the first dielectric material; and
   performing a planarization technique to form the isolation structure in the trench, the dielectric liner is formed from the first dielectric material and the dielectric core is formed from the second dielectric material.

16. The method of claim 15, wherein forming the electrode plate comprises:
   recessing the dielectric core to form an opening in the isolation structure, a portion of the dielectric liner is exposed in the opening to define lateral boundaries of the opening;
   depositing an electrode material in the opening, the electrode material is conformal to the opening; and removing a portion of the electrode material to leave a portion thereof on the dielectric liner.

17. The semiconductor device of claim 8, further comprising:

a first dielectric layer in the isolation structure laterally between the first electrode plate and the dielectric core; and a second dielectric layer in the isolation structure laterally adjacent to the first dielectric layer, wherein the second dielectric layer is laterally between the second electrode plate and the dielectric core, and the first dielectric layer is spaced apart from the second dielectric layer by the dielectric core.

\* \* \* \* \*